United States Patent
Guo

(10) Patent No.: US 11,960,751 B2
(45) Date of Patent: Apr. 16, 2024

(54) TEST PROGRAM GENERATION METHOD, DEVICE, MEMORY MEDIUM AND ELECTRONIC EQUIPMENT

(71) Applicant: Changxin Memory Technologies, Inc., Anhui (CN)

(72) Inventor: Ruei-Yuan Guo, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 459 days.

(21) Appl. No.: 17/214,724

(22) Filed: Mar. 26, 2021

(65) Prior Publication Data

US 2021/0216236 A1 Jul. 15, 2021

Related U.S. Application Data

(63) Continuation of application No. PCT/CN2019/116062, filed on Nov. 6, 2019.

(30) Foreign Application Priority Data

Nov. 16, 2018 (CN) .......................... 201811367342.1

(51) Int. Cl.
*G06F 3/06* (2006.01)
*G11C 29/08* (2006.01)
*G11C 29/54* (2006.01)

(52) U.S. Cl.
CPC .......... *G06F 3/0653* (2013.01); *G06F 3/0604* (2013.01); *G11C 29/08* (2013.01); *G11C 29/54* (2013.01)

(58) Field of Classification Search
CPC ..... G06F 3/0653; G06F 3/0604; G11C 29/08; G11C 29/54

(Continued)

(56) References Cited

U.S. PATENT DOCUMENTS 6,577,981 B1 6/2003 Grey et al.
8,918,681 B2 12/2014 Korogi et al.
(Continued)

FOREIGN PATENT DOCUMENTS

CN 102227716 A 10/2011
CN 103035300 A 4/2013
(Continued)

OTHER PUBLICATIONS

PCT International Preliminary Report on Patentability dated May 27, 2021, issued in related International Application No. PCT/CN2019/116062 (6 pages).

(Continued)

*Primary Examiner* — John Q Chavis
(74) *Attorney, Agent, or Firm* — Sheppard Mullin Richter & Hampton LLP

(57) ABSTRACT

A test program generation method, a test program generation device, a computer readable storage medium, and an electronic equipment are disclosed. The test program generation method includes: acquiring a configuration information of the memory and a test logic for the memory; determining at least one type of test program components from a preset test program component library according to the test logic; and acquiring a test program according to the configuration information by combining a plurality of test program components. Types of the plurality of test program components are included in the determined at least one type of test program components. The test program generation method not only meets different test requirements and matches different test conditions, but also avoids coding errors and improve the efficiency and accuracy in generating a memory test program.

20 Claims, 14 Drawing Sheets

(58) Field of Classification Search
USPC .......................................................... 717/131
See application file for complete search history.

(56) References Cited

U.S. PATENT DOCUMENTS

| | | | |
|---|---|---|---|
| 2011/0099431 A1 | 4/2011 | Almog et al. | |
| 2013/0024847 A1* | 1/2013 | Browne ............. | G06F 11/3604 717/131 |
| 2015/0039950 A1 | 2/2015 | Monroe et al. | |
| 2015/0377961 A1 | 12/2015 | Lin et al. | |
| 2016/0378627 A1 | 12/2016 | Lange et al. | |
| 2021/0056011 A1 | 2/2021 | Yasuda et al. | |

FOREIGN PATENT DOCUMENTS

| | | |
|---|---|---|
| CN | 105334448 A | 2/2016 |
| CN | 108363660 A | 8/2018 |
| CN | 108572312 A | 9/2018 |
| IN | 103135011 A | 6/2013 |
| JP | 2013-030017 A | 2/2013 |
| WO | 2017-037914 A1 | 3/2017 |

OTHER PUBLICATIONS

First Search dated Mar. 4, 2021, issued in related Chinese Application No. 201811367342.1 (2 pages).
First Office Action dated Mar. 15, 2021, issued in related Chinese Application No. 201811367342.1, with English machine translation (11 pages).
Supplementary Search dated Aug. 2, 2021, issued in related Chinese Application No. 201811367342.1 (1 page).
Supplementary Search dated Sep. 26, 2021, issued in related Chinese Application No. 201811367342.1 (1 page).
PCT International Search Report and the Written Opinion dated Feb. 12, 2020, issued in related International Application No. PCT/CN2019/116062 (7 pages).

* cited by examiner

TEST PROGRAM GENERATION METHOD, DEVICE, MEMORY MEDIUM AND ELECTRONIC EQUIPMENT

CROSS-REFERENCE TO RELATED APPLICATIONS

This application is a continuation application of International Patent Application No. PCT/CN2019/116062, filed on Nov. 6, 2019, which is based on and claims priority to and benefits of the Chinese Patent Applications No. 201811367342.1, filed with the State Intellectual Property Office (SIPO) of the People's Republic of China on Nov. 16, 2018. The entire content of the above-referenced applications are incorporated herein by reference.

TECHNICAL FIELD

The present disclosure relates to the technical field of semiconductor memories and, more specifically, to a test method, a test device, a computer readable storage medium, and an electronic equipment having the same.

BACKGROUND

Conventionally, memory manufacturers may provide a standard memory test encoding program for testing the memory products. However, the standard memory test encoding program may only be able to test the memories according to fixed timing specifications and test contents, which may lead to a low product verification analysis efficiency. For special test requirements and test conditions, the programs may be coded manually only. Coding errors in complex test programs with large data volume are likely to occur. Therefore, coding test programs for the large data volume according to memory language rules is an urgent problem needs to be solved.

It should be noted that the information disclose above is only for enhancement of understanding of the background of the present disclosure, and thus may include information that does not construe prior art known to those of ordinary skill in the art.

SUMMARY

The embodiments of the present disclosure provide a test method, a test device, a computer readable storage medium, and an electronic equipment having the same, thereby overcoming the problems of a low program coding efficiency and coding errors due to limitations of the related art.

One aspect of the present disclosure may be directed to a method for generating a test program configured to test a memory. The method may comprise acquiring a configuration information of the memory and a test logic for the memory, determining at least one type of test program components from a preset test program component library according to the test logic, and acquiring a test program according to the configuration information by combining a plurality of test program components, wherein types of the plurality of test program components are included in the determined at least one type of test program components.

In an exemplary embodiment of the present disclosure, the method may comprise determining a plurality of test units to be tested in the memory according to the configuration information, determining a correlation between the plurality of test program components and the plurality of test units according to the test logic, configuring each of the plurality of test program components with parameters based on the correlation, and acquiring the test program by combining the plurality of the test program components configured with the parameters.

In an exemplary embodiment of the present disclosure, the method may comprise determining test types of the plurality of test units respectively and test sequences of the test types respectively according to the test logic, determining an arrangement sequence of the plurality of the test program components configured with the parameters based on the test types and the test sequences, and combining the plurality of the test program components to acquire the test program according to the arrangement sequence.

In an exemplary embodiment of the present disclosure, the method may comprise determining a plurality of memory channels in the memory and test units to be tested in each of the plurality of memory channels according to the configuration information, determining a correlation between the plurality of test program components and the test units to be tested in each of the plurality of memory channels according to the test logic, configuring the plurality of test program components with parameters based on the correlation, acquiring a plurality of channel test subprograms corresponding to the plurality of memory channels by respectively combining the plurality of the test program components configured with the parameters with respect to the plurality of memory channels, and combining the plurality of channel test subprograms to acquire the test program.

In an exemplary embodiment of the present disclosure, the method may comprise determining test types of the test units to be tested in each of the plurality of memory channels respectively and test sequences of the test types respectively according to the test logic, determining an arrangement sequence of the plurality of the test program components configured with the parameters and the plurality of the test program components corresponding to the plurality of memory channels based on the test types and the test sequences, and combining the plurality of the test program components to acquire the plurality of channel test subprograms corresponding to the plurality of memory channels according to the arrangement sequence.

In an exemplary embodiment of the present disclosure, the method may further comprise acquiring timing interval information corresponding to the test logic, and adjusting timing intervals among the plurality of test program components in the test program based on the timing interval information.

In an exemplary embodiment of the present disclosure, the method may comprise acquiring a test task information for the memory and a test history record of the memory, and generating the test logic for the memory based on the test task information and the test history record.

Another aspect of the present disclosure may be directed to a device for generating a test program configured to test on a memory. The device may comprise an information acquiring module configured to acquire a configuration information of the memory and a test logic for the memory, a component acquiring module configured to determine at least one type of test program components from a preset test program component library according to the test logic, and a component combining module configured to acquire a test program matching the configuration information by combining a plurality of the test program components, wherein types of the plurality of test program components are included in the determined at least one type of test program components.

In an exemplary embodiment of the present disclosure, the device may comprise a first test unit determining submodule configured to determine a plurality of test units to be tested in the memory according to the configuration information, a first relationship determining submodule configured to determine a correlation between the plurality of test program components and the plurality of test units according to the test logic, a first parameter configuration submodule configured to configure each of the plurality of test program components with parameters based on the correlation, and a first component combining submodule, configured to acquire the test program by combining the plurality of the test program components configured with the parameters.

In an exemplary embodiment of the present disclosure, the device may comprise a first test sequence submodule configured to determine test types of the plurality of test units respectively and test sequences of the test types respectively according to the test logic, a first arrangement sequence submodule configured to determine an arrangement sequence of the plurality of the test program components configured with the parameters based on the test types and the test sequences, and a first test program submodule configured to combine the plurality of the test program components according to the arrangement sequence to acquire the test program.

In an exemplary embodiment of the present disclosure, the device may comprise a second test unit determining submodule configured to determine a plurality of memory channels in the memory and test units to be tested in each of the plurality of memory channels according to the configuration information, a second relationship determining submodule configured to determine a correlation between the plurality of test program components and the test units in each of the plurality of memory channels according to the test logic, a second parameter configuration submodule configured to configure the plurality of test program components with parameters based on the correlation, a second component combining submodule configured to acquire a plurality of channel test subprograms corresponding to the plurality of memory channels by respectively combining the plurality of the test program components configured with the parameters with respect to the plurality of memory channels, and a program combining submodule, configured to combine the plurality of channel test subprograms to acquire the test program.

In an exemplary embodiment of the present disclosure, the device may comprise a second test sequence submodule configured to determine test types of the test units to be tested in each of the plurality of memory channels respectively and test sequences of the test types respectively according to the test logic, a second arrangement sequence submodule configured to determine an arrangement sequence of the plurality of the test program components configured with the parameters and the plurality of the test program components corresponding to the plurality of memory channels based on the test types and the test sequences, and a second test program submodule configured to combine the plurality of test program components according to the arrangement sequence to acquire the plurality of channel test subprograms corresponding to the plurality of memory channels.

In an exemplary embodiment of the present disclosure, the device may further comprise a timing acquiring module configured to acquire timing interval information corresponding to the test logic, and a timing adjustment module configured to adjust timing intervals among the plurality of test program components in the test program based on the timing interval information.

In an exemplary embodiment of the present disclosure, the device may comprise a record acquiring submodule configured to acquire a test task information for the memory and a test history record of the memory, and a logic generating submodule, configured to generate the test logic for the memory based on the test task information and the test history record.

Another aspect of the present disclosure may be directed to a computer readable storage medium, storing a computer program, wherein the computer program is executed by a processor to perform the method for generating a test program described above.

Another aspect of the present disclosure may be directed to an electronic equipment comprising a processor and a computer readable storage medium configured to store executable instructions for the processor. The processor is configured to perform the method for generating a test program described above by executing the executable instructions.

According to the test method provided by the exemplary embodiments of the present disclosure, the method may select corresponding test program components from the test program component library, and combine them to acquire a test program which conforms to the test logic and matches the configuration information of the memory. Combining the test program components in such manner may not only meet different test requirements and match different test conditions, but also avoid coding error problems and improve the efficiency and accuracy in generating a memory test program.

BRIEF DESCRIPTION OF THE DRAWINGS

The accompanying drawings, which are incorporated in the description of the present disclosure as a part of the description, together with the description, illustrate embodiments of the present disclosure and explain the principle of the present disclosure. It is apparent that the drawings in the following description are only some of the embodiments of the present disclosure, and other drawings may be obtained from those skilled in the art without creative work.

DETAILED DESCRIPTION

Figure 1:
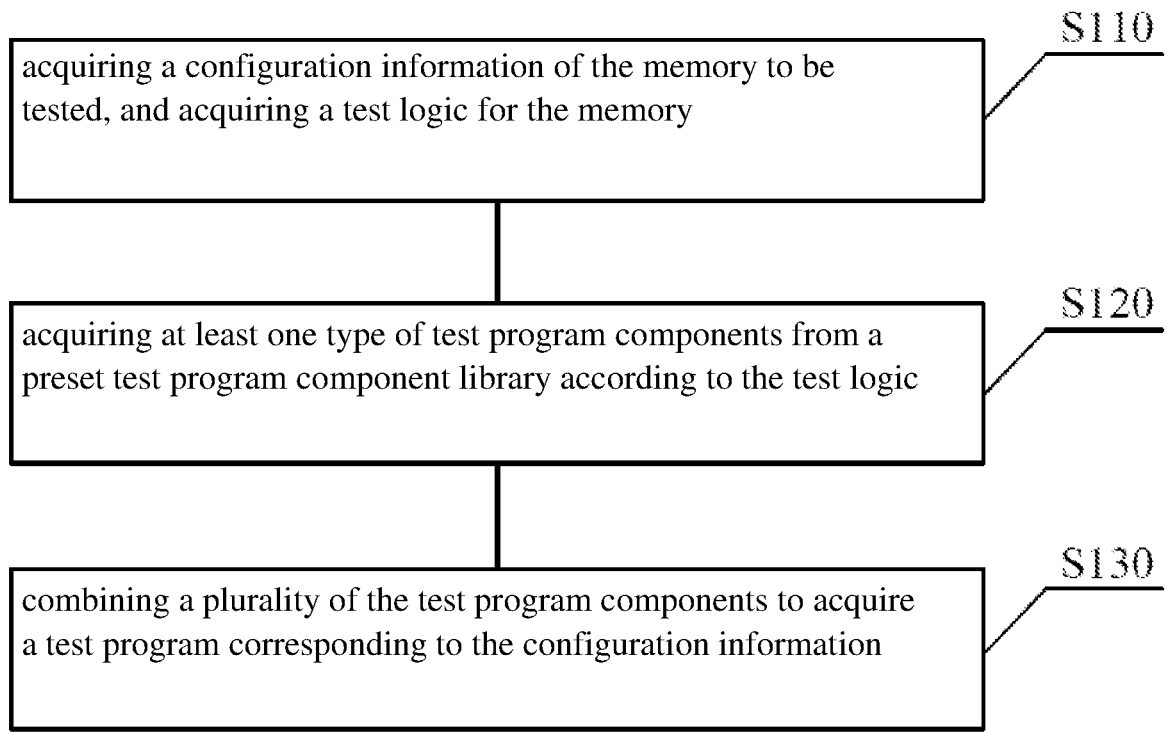
FIG. 1 is a flow chart of a test program generation method according to an embodiment of the present disclosure.

Exemplary embodiments will now be described in more details with reference to the accompanying drawings. However, the exemplary embodiments can be embodied in a variety of forms and should not be construed as being limited to the embodiments set forth herein. Instead, the exemplary embodiments may make the present disclosure to be more comprehensive and complete, and convey the concept of the present disclosure comprehensively to those skilled in the art. The described features, structures, or characteristics may be combined in any suitable manner in one or more embodiments of the present disclosure.

In addition, the drawings are merely illustrations of the present disclosure and are not necessarily drawn to scale. The same reference numerals in the drawings denote the same or similar parts, and any repeated description thereof will be omitted. Some of the block diagrams shown in the figures are functional entities and do not necessarily correspond to physically or logically independent entities. These functional entities may be implemented in software, implemented in one or more hardware modules or integrated circuits, or implemented in different network and/or processor devices and/or microcontroller devices.

The embodiment of the present disclosure may provide a test program generation method uses a test program for testing functions of a memory. The memory can be a Synchronous Dynamic Random Access Memory (SDRAM), especially, a Low Power Double Data Rate 4 (LPDDR4) or any other types of memory.

As shown in FIG. 1, the test program generation method provided in the embodiment may include the following steps.

In step S110, a configuration information of the memory to be tested and a test logic for the said memory may be acquired.

Accordingly, the configuration information of the memory to be tested and the test logic for the memory may be acquired. The configuration information may include various feature information related to test contents, such as memory channels, memory areas, and test units of the memory, and the test logic may depend on specific test requirements and test conditions.

In step S120, at least one type of test program components is determined from a preset test program component library according to the test logic.

In this step, one or more types of test program components may be determined based on the preset test program component library according to the test logic acquired in step S110. The test program component library stores a number of different types of test program components, and each of them may correspond to one or several different test functions. For example, the test program component library may include test program components that correspond to different test functions, such as "Activate" (ACT), "Precharge" (PRE), "Mode Register Read" (MRR), or "Mode Register Write" (MRW). For a simple test logic, the test may be implemented by a single test program component, and for a more complex test logic, the test may be implemented by a combination of a variety of different test program components.

In step S130, a plurality of the test program components is combined to acquire a test program corresponding to the configuration information.

In this step, after the one or more types of test program components are determined in step S120, a plurality of test program components may be combined to acquire a test program that corresponds to the configuration information acquired in step S110. The combined plurality of test program components may be the same type of test program components or different types of test program components, wherein the types of the plurality of test program components are included the determined one or more types of test program components from the preset test program component library. The number of combinations of the test program components and the types of combinations are in accordance with the configuration information of the memory to be tested and the specific test logic.

According to the test program generation method provided by the embodiments of the present disclosure, corresponding test program components are selected from the test program component library, and combined to acquire a test program which conforms to the test logic and the configuration information of the memory. Different combinations of the test program components may not only meet different test requirements and satisfy different test conditions, but also avoid the problem of coding errors and improve the efficiency and accuracy in generating a memory test program.

Figure 2:
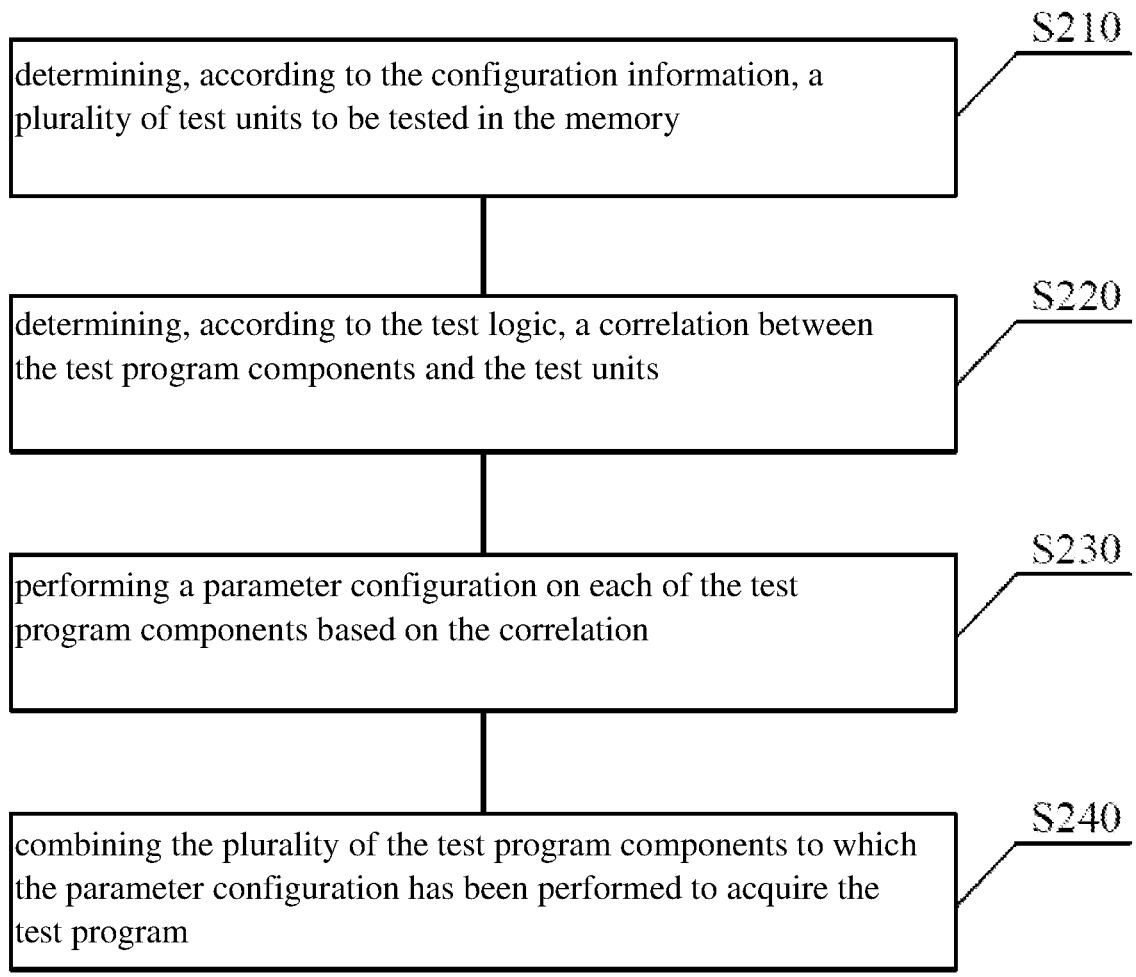
FIG. 2 is a flow chart of a test program generation method according to another embodiment of the present disclosure.

As shown in FIG. 2, according to another embodiment of the present disclosure, a plurality of the test program components may be combined to acquire a test program matching the configuration information, step S130 may further include the following steps.

In step S210, according to the configuration information, a plurality of test units to be tested is determined in the memory.

According to this step, a plurality of test units to be tested in the memory may be determined according to the configuration information of the memory, wherein each of the plurality of test units may be an area in the memory bonded by certain address ranges in the memory, for example, a bank defined by certain ranges of row addresses and column addresses.

In step S220, according to the test logic, a correlation between the test program components and the test units may be determined.

In this step, the correlation between the test program components and the test units can be determined according to the test logic acquired in step S110. In other words, in this step, under the overall framework of the test logic, the test contents to be performed on each of the test units under the certain timing conditions may be determined.

In step S230, a parameter configuration may be performed on each of the test program components based on the correlation between the test program components and the test units.

In this step, the parameter configuration may be performed on each of the test program components based on the correlation determined in step S220. Specifically, values of corresponding parameters in each of the test program components may be assigned, thereby converting the original generalized test program components into the test program components associated with each of the test units under different timing conditions.

In step S240, the plurality of the test program configured with the parameters may be combined to acquire the test program.

In this step, the test program components configured with the parameters in step S230 are combined to generate the test program conforming to the test logic.

In the embodiment of the present disclosure, using the test units as a basis for assigning parameters of the test program components can refine the test logic to achieve an accurate testing. The test program generation method in the embodiment is applicable to a memory having a single memory channel, or a memory having a plurality of memory channels but individual tests of individual memory channels do not have special test requirements.

Figure 3:
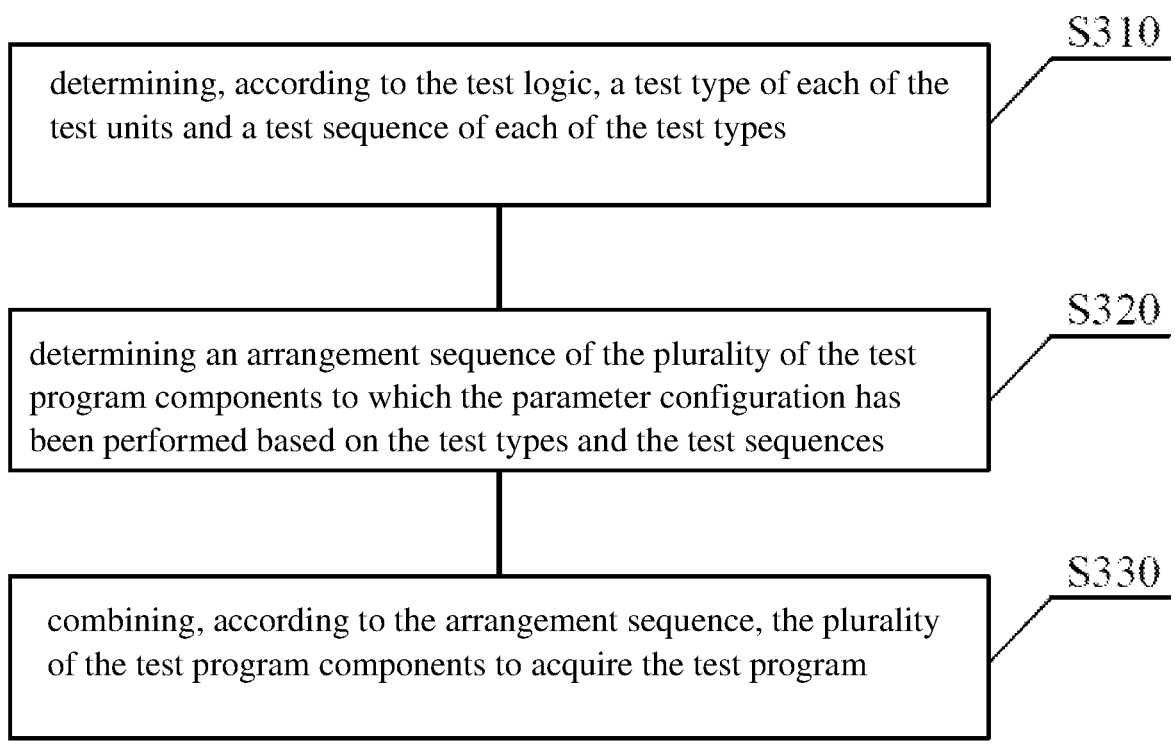
FIG. 3 is a flow chart of a test program generation method according to another embodiment of the present disclosure.

As shown in FIG. 3, based on the above embodiment, the plurality of the test program components configured with the parameters may be combined to acquire the test program, step 240 may further include the following steps.

In step S310, according to the test logic, a test type of each of the test units and a test sequence of each of the test types may be determined.

In this step, the test type of each test unit and a test sequence of each test type may be determined according to the test logic acquired in step S110. The test sequence of each test type depends on the timing conditions in the test logic. Different test units may have the same or different test types, and the test sequences of individual test types of different test units may be interleaved with each other.

In step S320, an arrangement sequence of the plurality of the test program components configured with the parameters may be determined based on the test types and the test sequences.

In this step, the arrangement sequence of the plurality of the test program components configured with the parameters can be determined based on the test type and the test sequence determined in step S310. The arrangement sequence may be configured according to the timing conditions in the test logic.

In step S330, according to the arrangement sequence, the plurality of the test program components may be combined to acquire the test program.

In this step, the plurality of the test program components may be combined according to the arrangement sequence determined in step S320 to acquire the test program conforming to the arrangement sequence. For example, a test program may follow the arrangement sequence of ACT 3, PRE 3, ACT 1, PRE 1, ACT 4, PRE 4, ACT 2, and PRE 2, wherein ACT stands for that the test program component is "activated" and PRE stands for that the test program component is "precharged", and the numbers 1, 2, 3, and 4 respectively represent four different test units.

Figure 4:
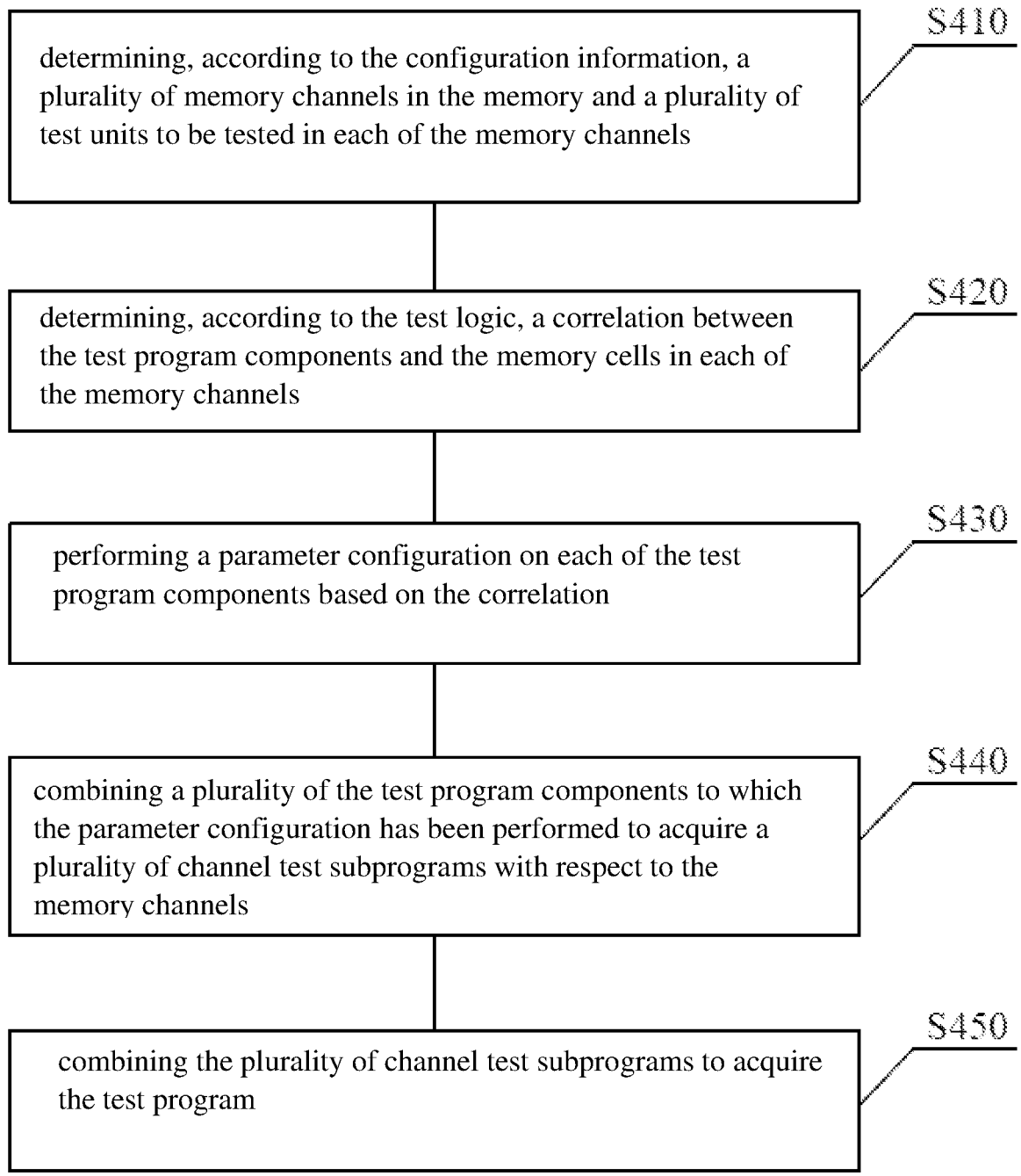
FIG. 4 is a flow chart of a test program generation method according to another embodiment of the present disclosure.

As shown in FIG. 4, in another embodiment of the present disclosure, a plurality of the test program components is combined to acquire a test program matching the configuration information, step S130 may further include the following steps.

In step S410, according to the configuration information, a plurality of memory channels in the memory and a plurality of test units to be tested in each of the memory channels may be determined.

In this step, the plurality of memory channels in the memory can be determined according to the configuration information of the memory to be tested, and the plurality of test units to be tested located in different memory channels can also be determined. The test units may be areas in the memory within certain address ranges in different memory channels, for example, a bank defined by certain ranges of row addresses and column addresses.

In step S420, according to the test logic, a correlation between the test program components and the test units in each of the memory channels may be determined.

In this step, the correlation between the test program components and the test units in each of the memory channels can be determined according to the test logic acquired in step S110. In other words, in this step, under the overall framework of the test logic, the test contents that to be performed on each of the test units under the certain timing conditions can be determined.

In step S430, a parameter configuration may be performed on each of the test program components based on the correlation between the test program components and the test units in each of the memory channels.

In this step, the parameter configuration is performed on each of the test program components based on the correlation determined in step S420. Specifically, values of corresponding parameters in each of the test program components can be assigned, thereby converting the original generalized test program components into test program components associated with each of the test units in each of the memory channels under different timing conditions.

In step S440, a plurality of the test program components configured with the parameters d is respectively combined corresponding to the memory channels to acquire a plurality of channel test subprograms.

For each of the memory channels, in this step, the test component components configured with the parameters can be combined to acquire a channel test subprogram corresponding to the memory channel.

In step S450, the plurality of channel test subprograms may be combined to acquire the test program.

Further, the plurality of channel test subprograms corresponding to the memory channels and acquired in step S440 may be combined to acquire a test program for the entire memory.

The test program generation method in the present embodiment is applicable to a memory having a plurality of memory channels and individual memory channels having distinguished functional tests.

Figure 5:
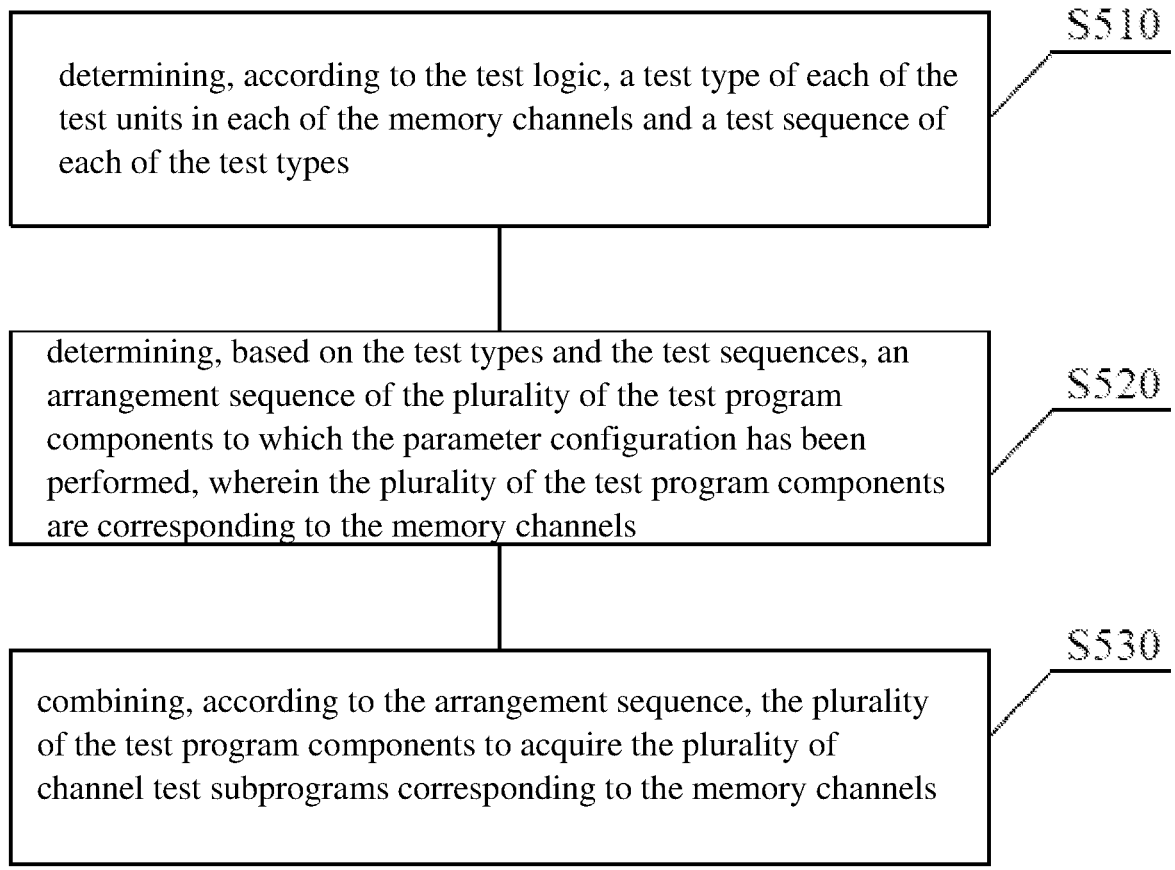
FIG. 5 is a flow chart of a test program generation method according to another embodiment of the present disclosure.

As shown in FIG. 5, based on the above embodiment, a plurality of the test program components configured with the parameters may be combined to acquire a plurality of channel test subprograms corresponding to the memory channels, step S440 may further include the following step.

In step S510, according to the test logic, a test type of each of the test units in each of the memory channels and a test sequence of each of the test types may be determined.

In this step, the test type of each of the test units in each of the memory channels and the test sequence of each of the test types may be determined according to the test logic acquired in step S110. The test sequence of each of the test types depends on the timing conditions in the test logic. Different test units may have the same or different test types, and the test sequences of the individual test types of different test units may be interleaved with each other.

In step S520, based on the test types and the test sequences, an arrangement sequence of the plurality of the test program components configured with the parameters may be determined, wherein the plurality of the test program components corresponds to the memory channels.

In this step, the arrangement sequence of the plurality of the test program components configured with the parameters may be determined based on the test types and the test sequences determined in step S510, wherein the plurality of the test program components corresponds to the memory channels, and the arrangement sequence is configured according to the timing conditions in the test logic.

In step S530, according to the arrangement sequence, the plurality of the test program components may be respectively combined with respect to the memory channels to acquire the plurality of channel test subprograms.

In this step, the plurality of the test program components may be combined according to the arrangement sequence determined in step S520 to generate test programs with respect to the memory channels and conform to the arrangement sequence. For example, for a single memory channel, a test program may follow the sequence of ACT 1, PRE 1, ACT 2, PRE 2, ACT 2, PRE 2, ACT 1, PRE 1, and for another single memory channel, a test program may follow the arrangement sequence of ACT 3, PRE 3, ACT 1, PRE 1, ACT 4, PRE 4, ACT 2, PRE 2, wherein ACT stands for that the test program component is "activated" and PRE stands for that the test program component is "precharged", and the numbers 1, 2, 3, and 4 respectively represent four different test units.

Figure 6:
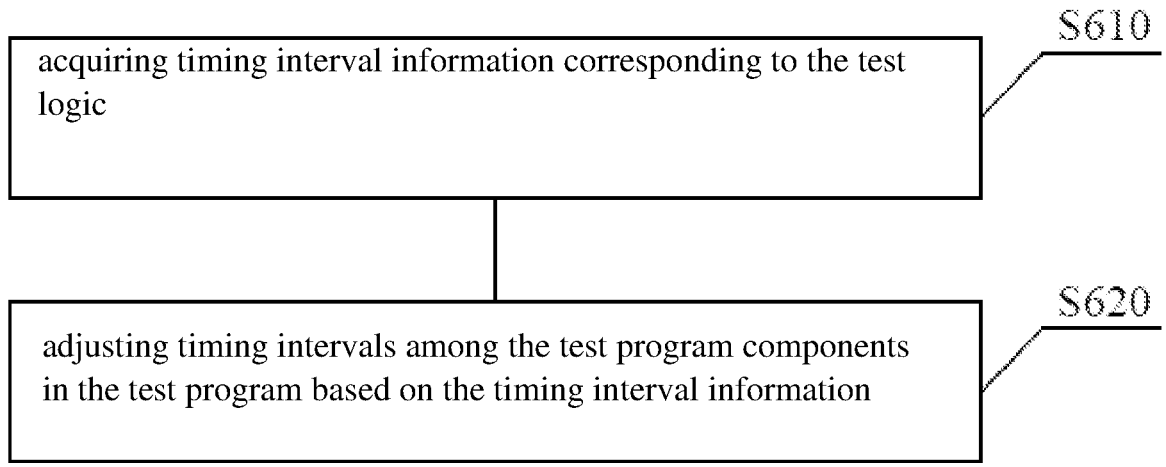
FIG. 6 is a flow chart of a test program generation method according to another embodiment of the present disclosure.

As shown in FIG. 6, based on the above embodiment, after step S130, a plurality of the test program components may be combined to acquire a test program matching the configuration information, the test program generation method may further include following steps.

In step S610, timing interval information corresponding to the test logic may be acquired.

In this step, the timing interval information corresponding to the test logic for the combined test program acquired in step S130 may be acquired, wherein the timing interval information may reflect the interval time of each test program component in the test program.

In step S620, timing intervals among the test program components in the test program may be adjusted based on the timing interval information.

In this step, the timing intervals among the test program components in the test program can be adjusted based on the timing interval information determined in step S610. Different timing interval information may not change the sequences in which the test program components operate, but may affect the overall operation performance of the test program.

Figure 7:
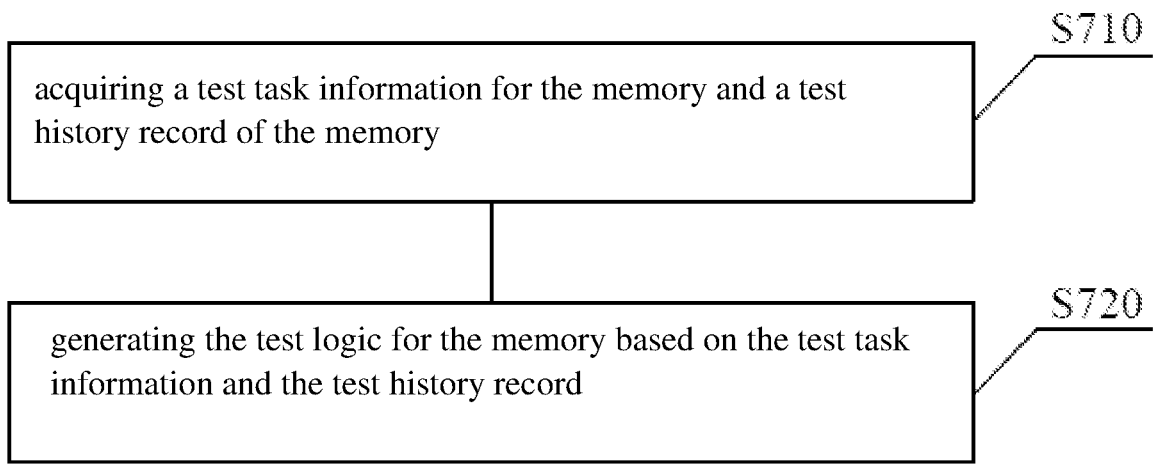
FIG. 7 is a flow chart of a test program generation method according to another embodiment of the present disclosure.

Further, as shown in FIG. 7, acquiring a test logic for the memory in step S110 may include the following steps.

In step S710, a test task information for the memory and a test history record of the memory may be acquired.

In this step, the test task information for the memory can be acquired, and the historical test record of the memory can also be acquired. The test task information may correspond to the test purpose, and may include functions of the memory to be tested. Log information may be generated synchronously during the test of the memory, and the test history record can be generated based on the log information. The test history record provides information of tests performed on the memory, test program components used in each test, and the test results for each test.

In step S720, the test logic for the memory may be generated based on the test task information and the test history record.

In this step, the test logic for the memory is generated based on the test task information and the test history record acquired in step S710, and subsequent operations of generating the test program is performed based on the test logic.

It should be noted that although the above embodiments describe various steps of the method in the present disclosure in a specific order, this does not require or imply that the steps must be performed in the specific order, or that all steps must be performed to achieve the desired result. Additionally or alternatively, certain steps may be omitted, multiple steps may be combined into one step for execution, and/or one step may be decomposed into multiple steps for execution.

In an embodiment of the present disclosure, a test program generation device configured to perform a functional test on a memory is also provided. The memory may be an SDRAM, and in particular may be LPDDR4 or any other type of memory.

Figure 8:
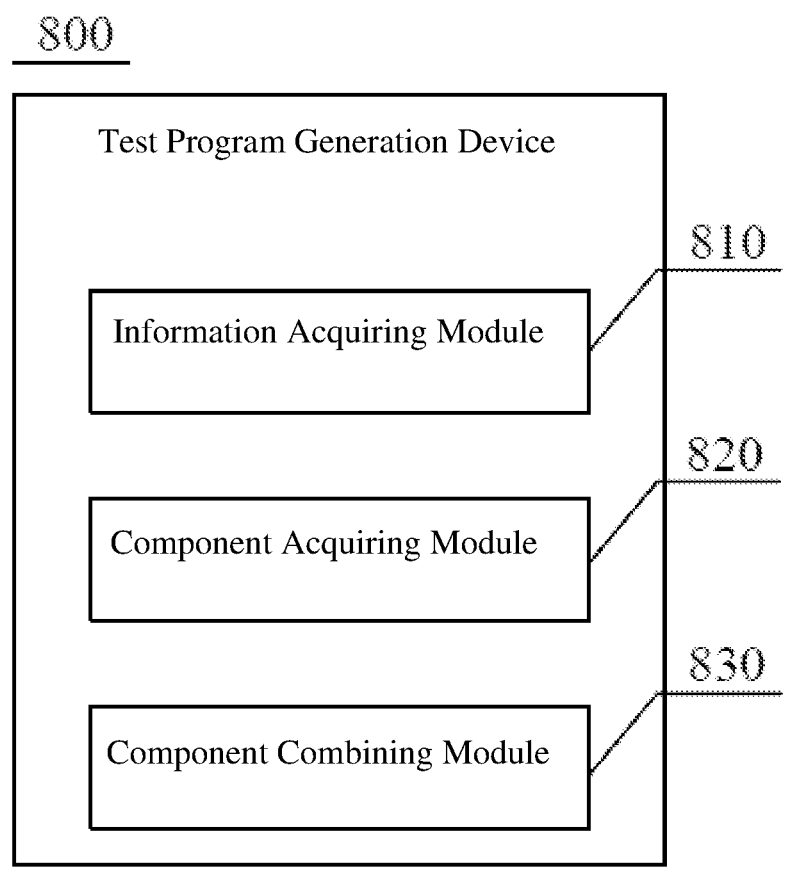
FIG. 8 is a block diagram of a test program generation device according to an embodiment of the present disclosure.

As shown in FIG. 8, the test program generation device 800 may include an information acquiring module 810, a component acquiring module 820, and a component combining module 830.

The information acquiring module 810 may be configured to acquire configuration information of the memory to be tested and acquire a test logic for the memory.

The information acquiring module 810 may be configured to acquire configuration information of the memory to be tested and test logic for the memory, wherein the configuration information may include various feature information related to the test contents, such as memory channels, memory areas, and test units of the memory, and the test logic with respect to specific test requirements and test conditions.

The component acquiring module 820 may be configured to determine at least one type of test program components from a preset test program component library according to the test logic.

Based on the test logic acquired by the information acquiring module 810, the component acquiring module 820 may determine one or more types of test program components from the preset test program component library. The test program component library stores a number of different types of test program components, each of the test program components can correspond to one or several different test functions. For example, test program components may correspond to different test functions, such as ACT, PRE, MRR, or MRW. A simple test logic may be implemented by a single test program component, and a more complex test logic may be implemented by a combination of a variety of different test program components.

The component combining module 830 may be configured to combine a plurality of the test program components to acquire a test program that matches the configuration information.

After the component acquiring module 820 determines one or more types of test program components, the component combining module 830 combines the plurality of test program components to acquire a test program that can match the configuration information acquired by the information acquiring module 810. The combined plurality of test program components may be the same type of test program components, or may be different types of test program components. The types of the plurality of test program components are included in the determined one or more types of test program components. The number of combinations of test program components and the types of combinations may be related to the configuration information of the memory to be tested, and may be also related to the specific test logic.

The test program generation device provided by the embodiment of the present disclosure, may select corresponding test program components from the test program component library, and combine them to acquire a test program which conforms to the test logic and matches the configuration information of the memory. Combining the test program components in such a manner not only meets different test requirements and satisfies different test conditions, but also avoids coding error problems and improve the efficiency and accuracy in generating a memory test program.

Figure 9:
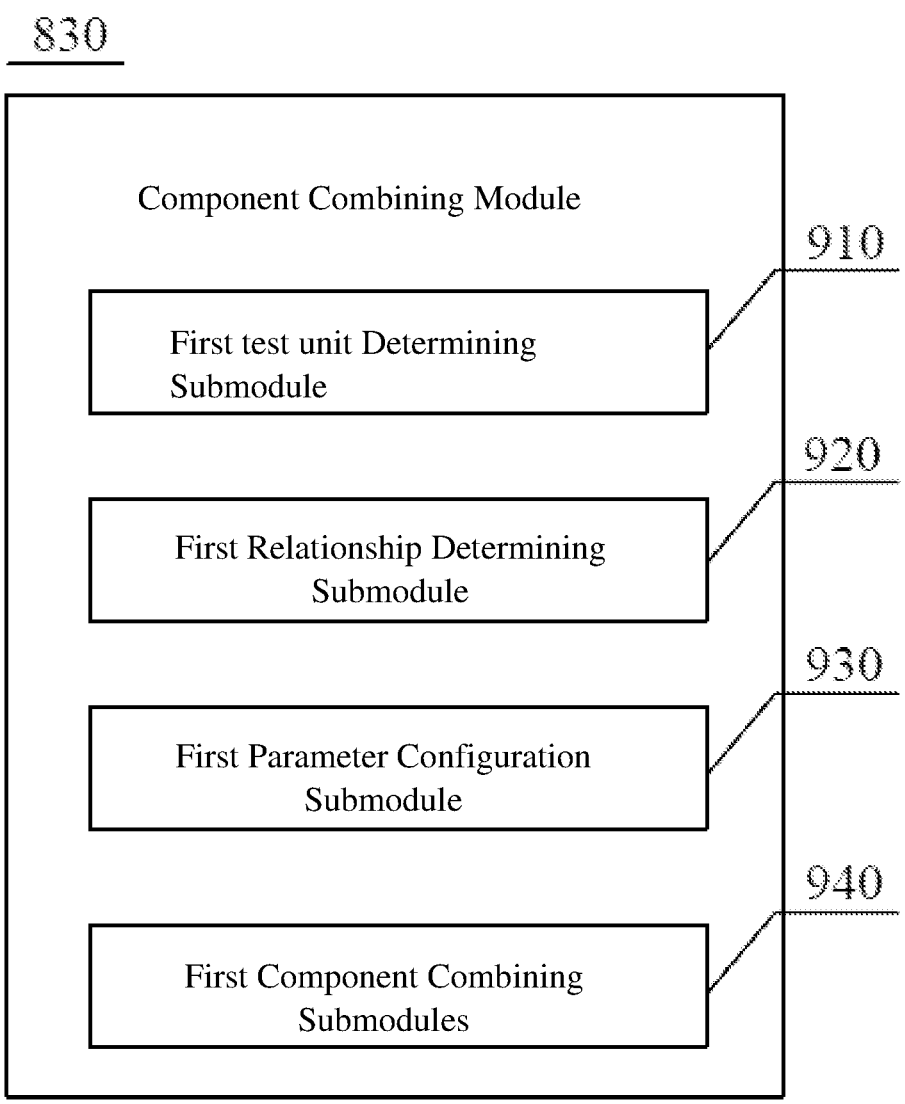
FIG. 9 is a block diagram of a test program generation device according to another embodiment of the present disclosure.

As shown in FIG. 9, in an embodiment of the present disclosure, the component combination module 830 may include a first test unit determining submodule 910, a first relationship determining submodule 920, a first parameter configuration submodule 930, and a first component combining submodules 940.

The first test unit determining submodule 910 may be configured to determine a plurality of test units to be tested in the memory according to the configuration information.

The first test unit determining submodule 910 may be configured to determine, according to configuration information of the memory to be tested, a plurality of test units to be tested in the memory, wherein the test unit may be a memory area bonded by certain address ranges in the memory, for example, may be a bank defined by certain ranges of row addresses and column addresses.

The first relationship determining submodule 920 may be configured to determine a correlation between the test program components and the test units according to the test logic.

According to the test logic acquired by the first test unit determining submodule 910, the first relationship determining submodule 920 can determine a correlation between the test program components and the test units. In other words, the first relationship determining submodule 920 can, under the overall framework of the test logic, determine the test contents to be performed on each of the test units under certain timing conditions.

The first parameter configuration submodule 930 may be configured to perform parameter configuration on each of the test program components based on the correlation.

Based on the correlation determined by the first relationship determining submodule 920, the first parameter configuration submodule 930 may configure the parameters on each of the test program components. Specifically, the first parameter configuration submodule 930 assigns values to related parameters in each of the test program components, thereby converting the original generalized test program components into test program components associated with each of the test units under different timing conditions.

The first component combining submodule 940 may be configured to combine the plurality of test program components configured with the parameters to acquire the test program.

After the parameter configuration of the test program components is completed by the first parameter configuration submodule 930, the first component combining submodule 940 may combine the test program components to generate a test program that conforms to the test logic.

In the embodiment of the present disclosure, using the test units in the memory as a basis for assigning the parameters of the test program components can refine the test logic to achieve the accurate testing. The test program generation device in the present embodiment is applicable to a memory having a single memory channel, or a memory having a plurality of memory channel but each of the memory channels does not have special test requirements.

Figure 10:
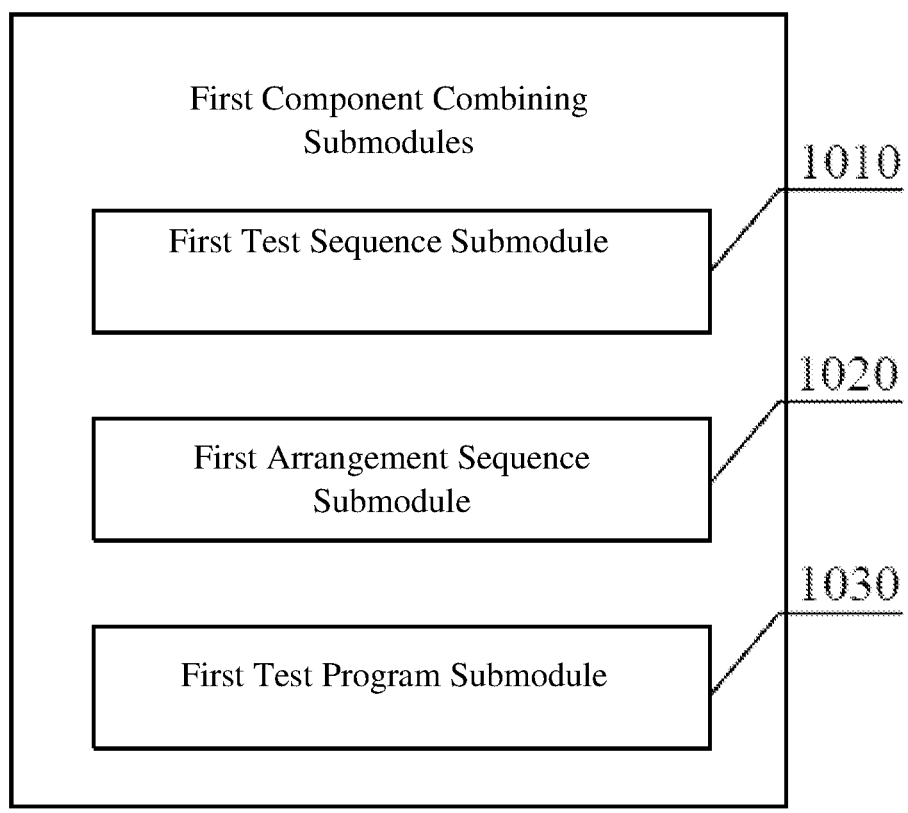
FIG. 10 is a block diagram of a test program generation device according to another embodiment of the present disclosure.

As shown in FIG. 10, based on the above embodiments, the first component combining submodule 940 may further include a first test sequence submodule 1010, a first arrangement sequence submodule 1020, and a first test program submodule 1030.

The first test sequence submodule 1010 may be configured to determine a test type of each of the test units and a test sequence of each of the test types according to the test logic.

According to the test logic acquired by the information acquiring module 810, the first test sequence submodule 1010 can determine the test type of each of the test units and the test sequence of each of the test types. The test sequence of each of the test types may depend on the timing conditions in the test logic. Different test units may have the same or different test types, and the test sequences of the individual test type of different test units may be interleaved with each other.

The first arrangement sequence submodule 1020 may be configured to determine an arrangement sequence of the plurality of test program components configured with the parameters based on the test types and the test sequences.

Based on the test types and the test sequences determined by the first test sequence submodule 1010, the first arrangement sequence submodule 1020 may determine an arrangement sequence of the plurality of test program components configured with the parameters, wherein the arrangement sequence is set according to the timing conditions in the test logic.

The first test program submodule 1030 may be configured to combine a plurality of test program components according to the arrangement sequence to acquire the test program.

According to the arrangement sequence determined by the first arrangement sequence submodule 1020, the first test program submodule 1030 may combine the plurality of the test program components to acquire the test program conforming to the arrangement sequence. For example, a test program may follow the arrangement sequence of ACT 3, PRE 3, ACT 1, PRE 1, ACT 4, PRE 4, ACT 2, PRE 2, wherein ACT stands for that the test program component is "activated" and PRE stands for that the test program component is "precharged", and the numbers 1, 2, 3, and 4 respectively represent four different test units.

Figure 11:
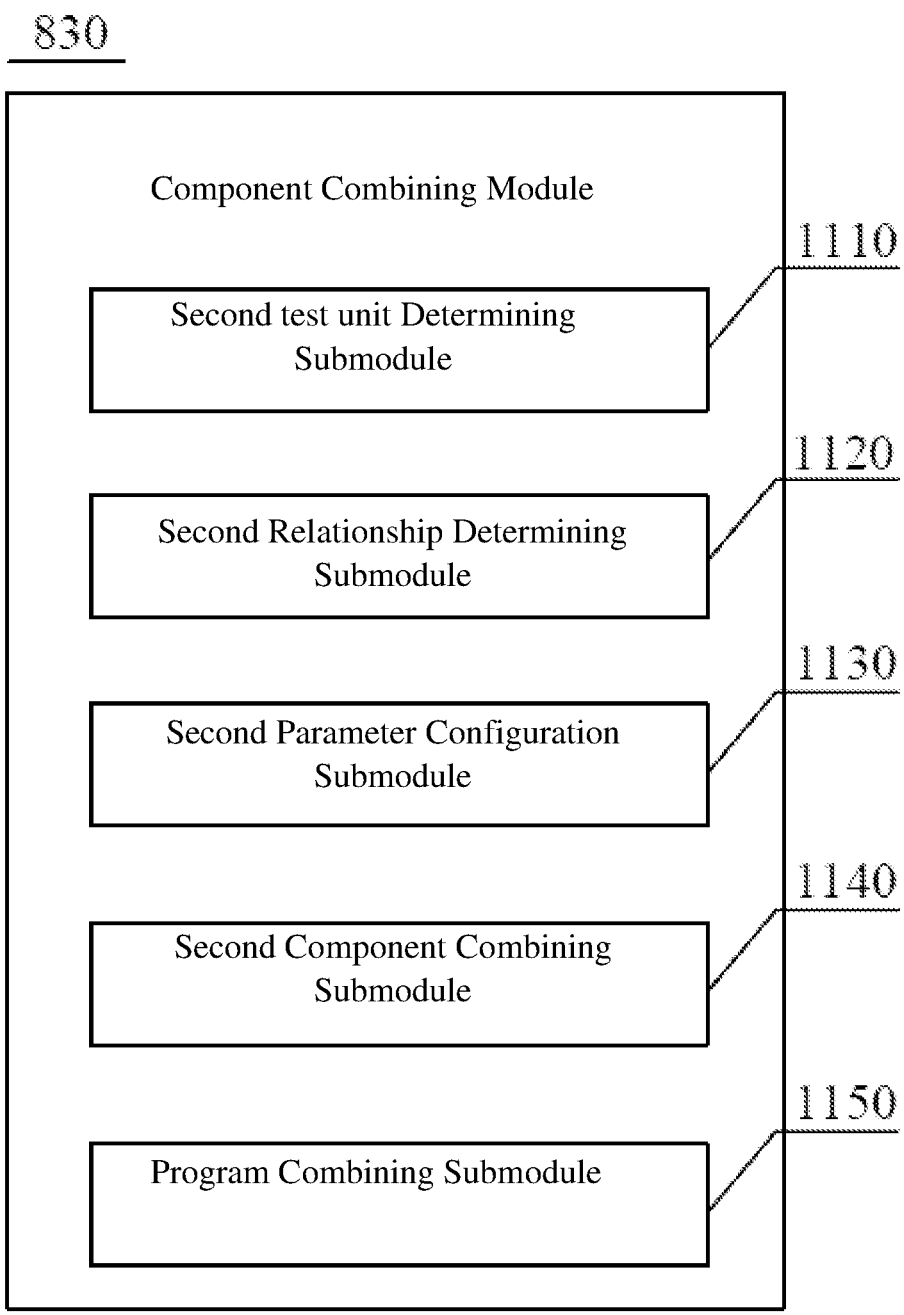
FIG. 11 is a block diagram of a test program generation device according to another embodiment of the present disclosure.

As shown in FIG. 11, in another embodiment of the present disclosure, the component combining module 830 may include a second test unit determining submodule 1110, a second relationship determining submodule 1120, a second parameter configuration submodule 1130, the second component combining submodule 1140, and the program combining submodule 1150.

The second test unit determining submodule 1110 may be configured to determine a plurality of memory channels in the memory and a plurality of test units to be tested in each of the memory channels according to the configuration information.

The second test unit determining submodule 1110 may determine a plurality of memory channels in the memory according to configuration information of the memory to be tested, and may determine a plurality of test units to be tested in different memory channels. The test units may be memory areas bonded by certain address ranges in different memory channels, and may be, for example, a bank defined by certain ranges of row addresses and column addresses.

The second relationship determining submodule 1120 may be configured to determine a correlation between the test program components and the test units in each of the memory channels according to the test logic.

According to the test logic acquired by the information acquiring module 810, the second relationship determining submodule 1120 can determine a correlation between the test program components and the test units in each of the memory channels. In other words, the second relationship determining submodule 1120 can, under the overall framework of the test logic, determine the test content that needs to be performed on each of the test units under certain timing conditions.

The second parameter configuration submodule 1130 may be configured to perform parameter configuration on each of the test program components based on the correlation.

Based on the correlation determined by the second relationship determining submodule 1120, the second parameter configuration submodule 1130 performs a parameter configuration on each of the test program components. Specifically, the second parameter configuration submodule 1130 assigns values to related parameters in each of the test program components, thereby converting the original generalized test program components into test program components associated with each of the test units under different timing conditions.

The second component combining submodule 1140 may be configured to combine the plurality of test program components configured with the parameters to acquire channel test subprograms corresponding to the memory channels.

For each memory channel, the second component combining submodule 1140 can combine the plurality of test program components configured with the parameters to acquire a channel test subprogram with respect to the memory channel.

The program combining submodule 1150 may be configured to combine the plurality of channel test subprograms to acquire the test program.

The plurality of channel test subprograms acquired by the second component combining submodule 1140 and with respect to the memory channels are combined to acquire a test program for the entire memory.

The test program generation device in the present embodiment is applicable to a memory having a plurality of memory channels and individual memory channels have distinguished functional tests.

Figure 12:
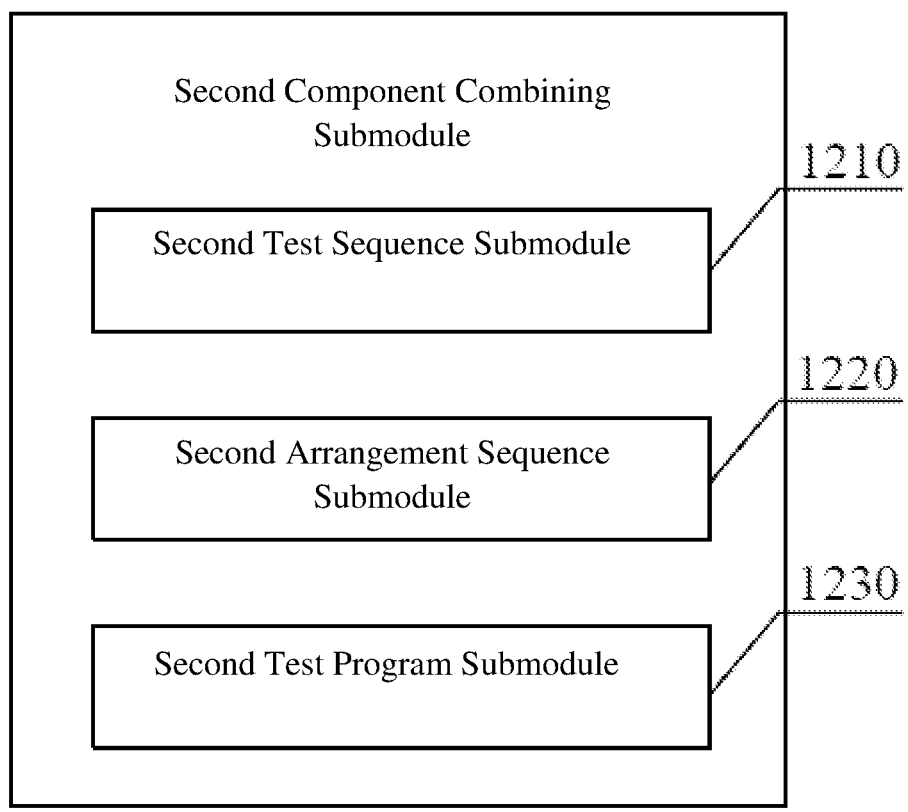
FIG. 12 is a block diagram of a test program generation device according to another embodiment of the present disclosure.

As shown in FIG. 12, based on the above embodiment, the second component combining submodule 1140 may further include a second test sequence submodule 1210, a second arrangement sequence submodule 1220, and a second test program submodule 1230.

The second test sequence submodule 1210 may be configured to determine a test type of each of the test units in each of the memory channels and a test sequence of each of the test types according to the test logic.

According to the test logic acquired by the information acquiring module 810, the second test sequence submodule 1210 can determine the test type of each of the test units in each of the memory channels and the test sequence of each of the test types. The test sequence of each of the test types depends on the timing conditions in the test logic. Different test units may have the same or different test types, and the test sequences of the individual test types of different test units may be interleaved with each other.

The second arrangement sequence submodule 1220 may be configured to determine an arrangement sequence of the plurality of test program components configured with the parameters, wherein the plurality of the test program components correspond to the memory channels based on the test types and the test sequences.

Based on the test types and the test sequences determined by the second test sequence submodule 1210, the second arrangement sequence submodule 1220 may determine an arrangement sequence of the plurality of test program components configured with the parameters, wherein the plurality of the test program components correspond to the respective memory channels, and the arrangement sequence may be configured according to the timing conditions in the test logic.

The second test program submodule 1230 may be configured to combine the plurality of test program components according to the arrangement sequence to acquire the plurality of channel test subprograms with respect to the memory channels.

In accordance with the arrangement sequence determined by the second arrangement sequence submodule 1220, the second test program submodule 1230 combines the plurality of the test program components to generate test programs which correspond to the memory channels and conform to the arrangement sequence. For example, for a single memory channel, a test program may follow the sequence of ACT 1, PRE 1, ACT 2, PRE 2, ACT 2, PRE 2, ACT 1, PRE 1, and for another single memory channel, a test program may follow the arrangement sequence of ACT 3, PRE 3, ACT 1, PRE 1, ACT 4, PRE 4, ACT 2, PRE 2, wherein ACT stands for that the test program component is "activated" and PRE stands for that the test program component is "precharged", and the numbers 1, 2, 3, and 4 respectively represent four different test units.

Figure 13:
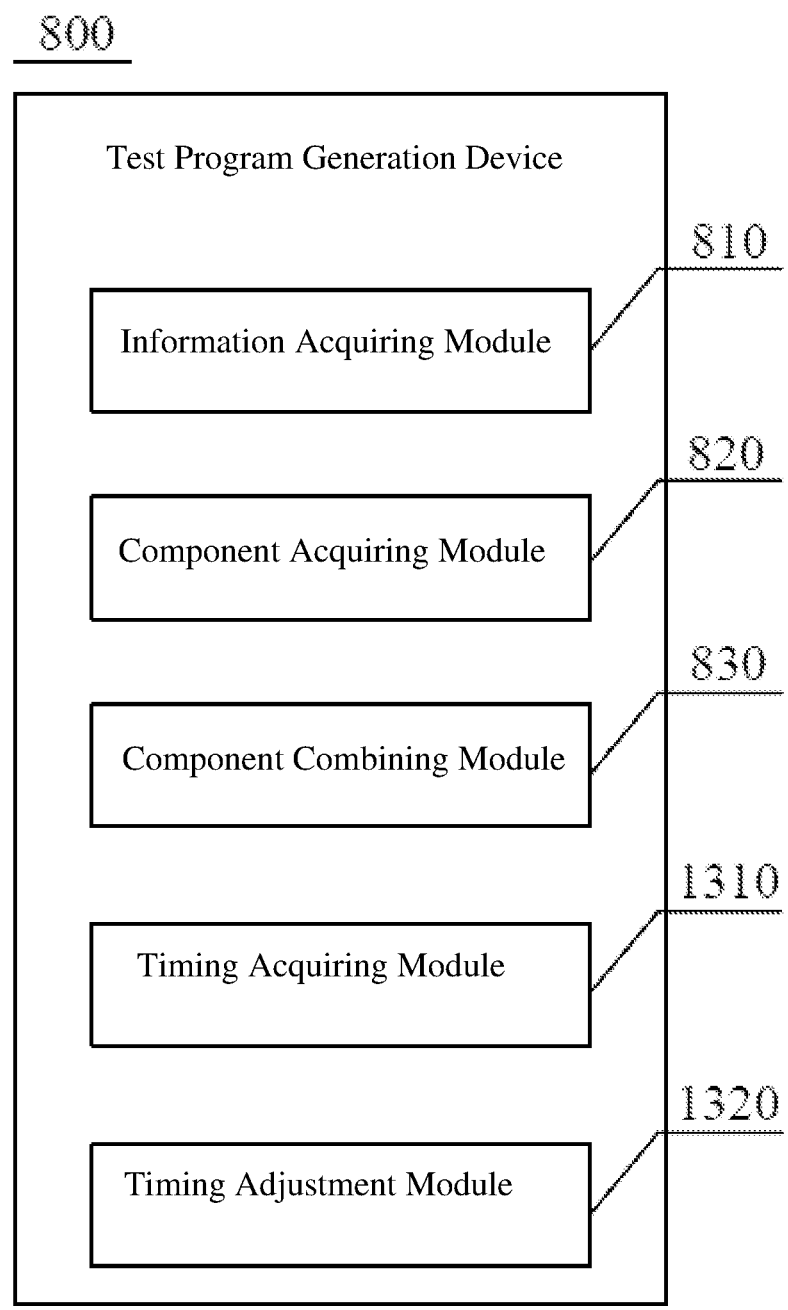
FIG. 13 is a block diagram of a test program generation device according to another embodiment of the present disclosure.

As shown in FIG. 13, based on the above embodiment, the test program generation device 800 may further include a timing acquiring module 1310 and a timing adjustment module 1320.

The timing acquiring module 1310 may be configured to acquire timing interval information corresponding to the test logic.

For the test program combined by the component combining module 830, the timing acquiring module 1310 can acquires timing interval information corresponding to the test logic, and the timing interval information can reflect the interval time of each test program component in the test program.

The timing adjustment module 1320 may be configured to adjust timing intervals among the test program components in the test program based on the timing interval information.

Based on the timing interval information determined by the timing acquiring module 1310, the timing adjustment module 1320 can adjust the timing intervals among the test program components in the test program. Different timing interval information may not change the sequence in which the various test program components operate, but may affect the overall operational performance of the test program.

Figure 14:
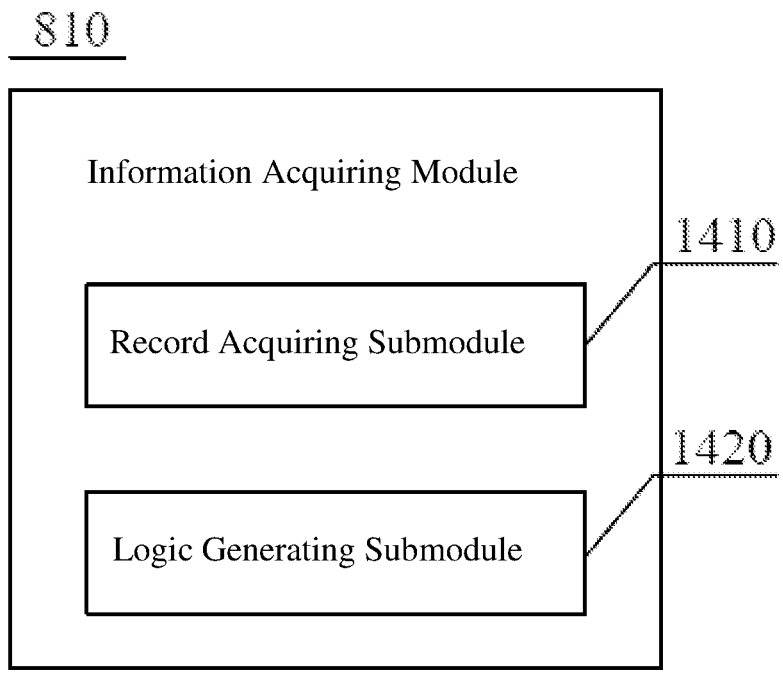
FIG. 14 is a block diagram of a test program generation device according to another embodiment of the present disclosure.

Further, as shown in FIG. 14, the information acquiring module 810 may at least include a record acquiring submodule 1410 and a logic generating submodule 1420.

The record acquiring submodule 1410 may be configured to acquire a test task information for the memory and a test history record of the memory.

The record acquiring submodule 1410 can acquire a test task information for the memory, and can also acquire a test history record of the memory. The test task information may correspond to the test purpose, that is, it may include which functions of the memory shall be tested. Log information may be generated synchronously during the test of the memory, and a test history record can be generated based on the log information. The test history record provides information on which tests have been performed on the memory, which test program components are used in each test, and the test results for each test.

The logic generating submodule 1420 may be configured to generate test logic for the memory based on the test task information and the test history record.

Based on the test task information and the test history record acquired by the record acquiring submodule 1410, the logic generating submodule 1420 may generate the test logic for the memory and perform subsequent operations of generating the test program based on the test logic.

It should be noted that although several modules or units of equipment for action execution are mentioned in the detailed description above, such division is not mandatory. Indeed, in accordance with embodiments of the present disclosure, the features and functions of two or more modules or units described above may be embodied in one module or unit. Conversely, the features and functions of one of the modules or units described above may be further divided into multiple modules or units.

In an embodiment of the present disclosure, a computer readable storage medium is provided for storing a computer program. When executed by a processor, the computer program may implement the test program generation method disclosed in the above embodiments of the present disclosure. In some embodiments, various aspects of the present disclosure may also be implemented in the form of a program product including program codes. The program product may be stored in a non-volatile storage medium (which may be a CD-ROM, a USB flash disk or a mobile hard disk or the like) or on a network. When the program product runs on a computing device (which may be a personal computer, a server, a terminal device, or a network device, etc.), the program codes may cause the computing device to implement the method according to the various embodiments described above in the present disclosure.

Figure 15:
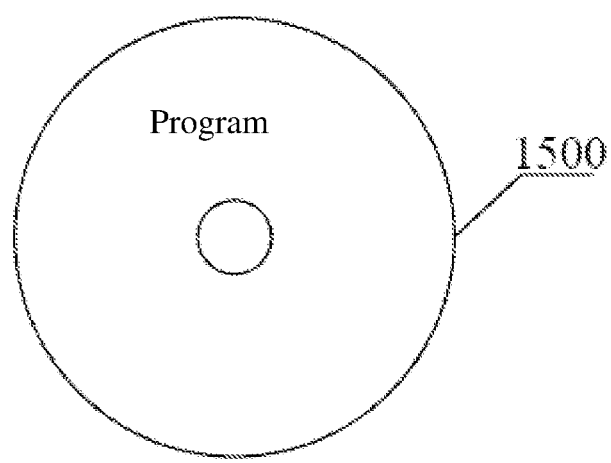
FIG. 15 is a schematic diagram of a program product according to an embodiment of the present disclosure.

Referring to FIG. 15, according to an embodiment of the present disclosure, a program product 1500 for implementing the above method may employ a portable compact disk read only memory (CD-ROM) and include program codes, and may runs on a computing device (e.g., a personal computer, a server, a terminal device, or a network device). However, the program product of the present disclosure is not limited thereto. In the embodiments of the present disclosure, a computer readable storage medium may include any tangible medium that can contain or store a program that can be combined with and used by an instruction execution system, an apparatus, or a device.

The program product may employ any combination of one or more readable medium. The readable medium may be a readable signal medium or a readable storage medium.

The readable storage medium can be, for example, but not limited to, an electronic, magnetic, optical, electromagnetic, infrared, or semiconductor system, apparatus, or device, or any combination of the above. More specific examples (non-exhaustive lists) of readable storage medium include: electrical connections by one or more wires, a portable disk, a hard disk, a random access memory (RAM), a read only memory (ROM), a erasable programmable read only memory (EPROM or flash memory), an optical fiber, a portable compact disk read only memory (CD-ROM), an optical memory device, a magnetic memory device, or any suitable combination of the foregoing.

The readable signal medium may include data signals that are transmitted in the baseband or as part of a carrier, and may include readable program codes. Such transmitted data signals may be in a variety of forms including, but not limited to, an electromagnetic signal, an optical signal, or any suitable combination of the foregoing. The readable signal medium may also be any readable medium other than a readable storage medium, and the readable medium can transmit, propagate, or transport a program combined with or used by one or combinations of an instruction execution system, apparatus, and device.

Program codes included in a readable medium can be transmitted by any suitable medium, including but not limited to wireless medium, wired medium, optical cable, RF, etc., or any suitable combination of the foregoing.

Program codes for performing the operations of the present disclosure may be written in any combination of one or more programming languages, including an object oriented programming language, such as Java, C++, etc., and conventional procedural programming language, such as the C language or a similar programming language. The program codes can execute entirely on the user computing device, partially on the user computing device, as a stand-alone software package, partially on the remote computing device and partially on the user computing device, or entirely on the remote computing device or on the server. In the case of a remote computing device, the remote computing device can be connected to the user computing device via any kind of network, including a local area network (LAN) or wide area network (WAN), or can be connected to an external computing device, for example, by internet provided by an internet service provider.

In an embodiment of the present disclosure, an electronic equipment comprising at least one processor and at least one computer-readable storage configured to store instructions executable by the processor is provided. The processor may be configured to perform the method described above in various embodiments of the present disclosure by executing the executable instructions.

The electronic equipment 1600 in the present embodiment may be described below with reference to FIG. 16. The electronic equipment 1600 is merely an example and should not impose any limitation on the functions and scope of use of the embodiments of the present disclosure.

Figure 16:
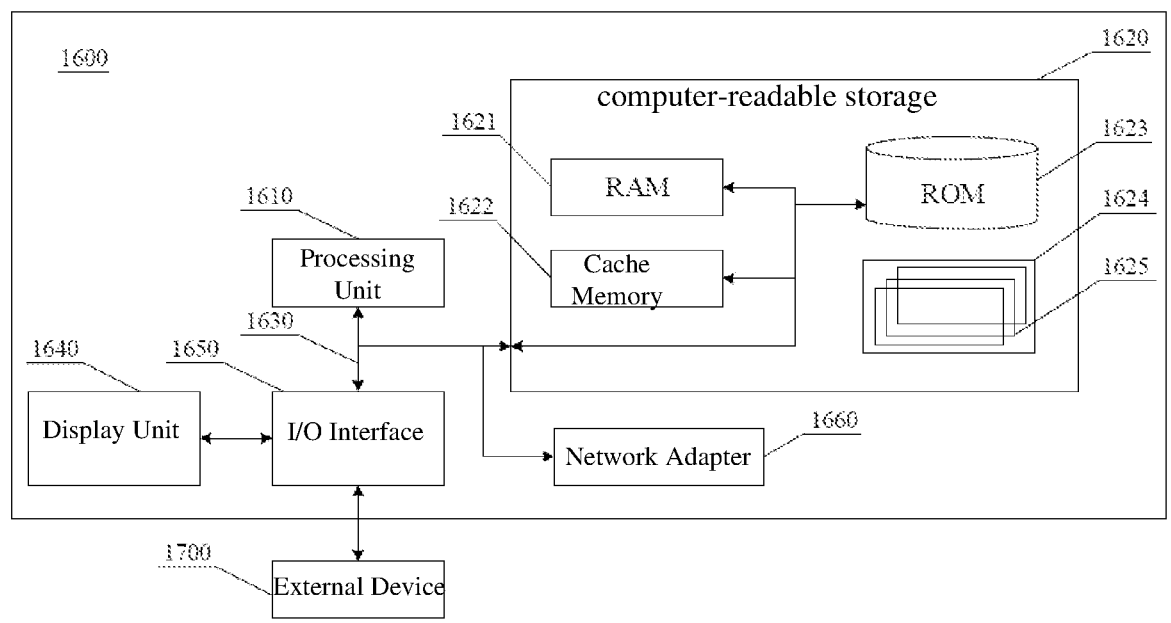
FIG. 16 is a schematic diagram of an electronic equipment according to an embodiment of the present disclosure.

Referring to FIG. 16, electronic equipment 1600 is embodied in the form of a general purpose computing device. Components of the electronic equipment 1600 can include, but are not limited to, at least one processing unit 1610, at least one computer-readable storage 1620, a bus 1630 that connects different system components (including the processing unit 1610 and the computer-readable storage 1620), and a display unit 1640.

The computer-readable storage 1620 stores program codes, which can be executed by the processing unit 1610, such that the processing unit 1610 performs the method described above in various embodiments of the present disclosure.

The computer-readable storage 1620 may include a readable medium in the form of a volatile storage, such as a random access memory 1621 (RAM) and/or a cache memory 1622, and may further include a read only memory 1623 (ROM).

The computer-readable storage 1620 may also include a program/utility 1624 having a set (at least one) of the program modules 1625, such program modules includes but not limited to: an operating system, one or more applications, other program modules, and program data. A network environment may be implemented in one or combinations of the examples.

The bus 1630 may represent one or more of several types of bus structures, including a memory bus, or a local area bus of a memory controller, a peripheral bus, a graphics acceleration port, a processing unit, or using any bus structures in the various buses. The electronic equipment 1600 may also be in communication with one or more external devices 1700 (e.g., a keyboard, a pointing device, a Bluetooth device, etc.), and may also be in communication with one or more devices that enable the user to interact with the electronic equipment 1600, and/or with any device (e.g., a router, a modem, etc.) that can be in communication with one or more other computing devices. The communication may be achieved by an input/output (I/O) interface 1650. Further, the electronic equipment 1600 may communicate with one or more networks (e.g., a local area network (LAN), a wide area network (WAN), and/or a public network, such as the Internet) through a network adapter 1660. As shown in FIG. 16, the network adapter 1660 can communicate with other modules of electronic equipment 1600 via bus 1630. It should be understood that although not shown in the figures, other hardware and/or software modules may be utilized in conjunction with electronic equipment 1600, including but not limited to: microcode, device drivers, redundant processing units, external disk drive arrays, RAID systems, tape drives, and data backup memory systems, etc.

Those skilled in the art will appreciate that various aspects of the present disclosure can be implemented as a system, method, or program product. Accordingly, aspects of the present disclosure may be embodied in the form of a complete hardware, a complete software (including firmware, microcode, etc.), or a combination of hardware and software, which may be referred to "circuit," "module," or "system" herein.

Other embodiments of the present disclosure may be apparent to those skilled in the art, after considering the specification and practicing the invention disclosed herein. The present application covers any variations, uses, or adaptations of the present disclosure, which are in accordance with the general principles of the present disclosure and include common general knowledge or common technical means in the art that are not disclosed in the present disclosure. The specification and examples are illustrative only, the true scope and spirit of the present disclosure are indicated by the appended claims.

The features, structures, or characteristics described above may be combined in any suitable manners in one or more embodiments, and the features discussed in the various embodiments are interchangeable, if possible. In the description above, numerous specific details are set forth to provide a thorough understanding of the embodiments of the present disclosure. However, one skilled in the art will appreciate that the technical solution of the present disclosure may be practiced without one or more of the specific details, or other methods, components, materials, and the like may be employed. In other instances, well-known structures, materials, or operations are not shown or described in detail to avoid obscuring aspects of the present disclosure.

What is claimed is:

1. A method for generating a test program configured to test a memory, the method comprising:
   acquiring configuration information of the memory and a test logic for the memory;
   determining, according to the test logic, at least one type of test program components from a preset test program component library; and
   acquiring a test program according to the configuration information by combining a plurality of test program components, wherein types of the plurality of test program components are included in the determined at least one type of test program components, wherein after acquiring the test program according to the configuration information by combining the plurality of the test program components, the method further comprises:
   acquiring timing interval information corresponding to the test logic; and
   adjusting, based on the timing interval information, timing intervals among the plurality of test program components in the test program.

2. The method for generating a test program according to claim 1, wherein acquiring the test program according to the configuration information by combining the plurality of test program components comprises:
   determining, according to the configuration information, a plurality of test units to be tested in the memory;
   determining, according to the test logic, a correlation between the plurality of test program components and the plurality of test units;
   performing, based on the correlation, a parameter configuration on each of the plurality of test program components; and
   acquiring the test program by combining the plurality of the test program components configured with parameters.

3. The method for generating a test program according to claim 2, wherein acquiring the test program by combining the plurality of the test program components configured with parameters comprises:
   determining, according to the test logic, test types of the plurality of test units and test sequences of the test types;
   determining, based on the test types and the test sequences, an arrangement sequence of the plurality of the test program components configured with parameters; and
   combining, according to the arrangement sequence, the plurality of the test program components to acquire the test program.

4. The method for generating a test program according to claim 1, wherein acquiring the test program according to the configuration information by combining the plurality of test program components comprises:
   determining, according to the configuration information, a plurality of memory channels in the memory and test units to be tested in each of the plurality of memory channels;
   determining, according to the test logic, a correlation between the plurality of test program components and the test units to be tested in each of the plurality of memory channels;
   performing, based on the correlation, a parameter configuration on each of the plurality of test program components;

acquiring a plurality of channel test subprograms with respect to the plurality of memory channels by respectively combining the plurality of the test program components configured with parameters with respect to each of the plurality of memory channels; and combining the plurality of channel test subprograms to acquire the test program.

5. The method for generating a test program according to claim 4, wherein acquiring a plurality of channel test subprograms with respect to the plurality of memory channels by respectively combining the plurality of the test program components configured with parameters with respect to each of the plurality of memory channels comprises:

determining, according to the test logic, test types of the test units to be tested in each of the plurality of memory channels and test sequences of the test types;

determining, based on the test types and the test sequences, an arrangement sequence of the plurality of the test program components configured with parameters, and the plurality of the test program components with respect to the plurality of memory channels; and combining, according to the arrangement sequence, the plurality of the test program components to acquire the plurality of channel test subprograms with respect to each of the plurality of memory channels.

6. The method for generating a test program according to claim 1, wherein acquiring the test logic for the memory comprises:

acquiring a test task information for the memory and a test history record of the memory; and generating, based on the test task information and the test history record, the test logic for the memory.

7. A device for generating a test program configured to test a memory, the device comprising:

an information acquiring module, configured to acquire configuration information of the memory and a test logic for the memory;

a component acquiring module, configured to determine, according to the test logic, at least one type of test program components from a preset test program component library;

a component combining module, configured to acquire a test program according to the configuration information by combining a plurality of the test program components, wherein types of the plurality of test program components are included in the determined at least one type of test program components;

a timing acquiring module, configured to acquire timing interval information corresponding to the test logic; and a timing adjustment module, configured to adjust, based on the timing interval information, timing intervals among the plurality of test program components in the test program.

8. The device for generating a test program according to claim 7, wherein the component combining module comprises:

a first test unit determining submodule, configured to determine, according to the configuration information, a plurality of test units to be tested in the memory;

a first relationship determining submodule, configured to determine, according to the test logic, a correlation between the plurality of test program components and the plurality of test units;

a first parameter configuration submodule, configured to perform, based on the correlation, a parameter configuration on each of the plurality of test program components; and a first component combining submodule, configured to acquire the test program by combining the plurality of the test program components configured with parameters.

9. The device for generating a test program according to claim 8, wherein the first component combining submodule comprises:

a first test sequence submodule, configured to determine, according to the test logic, test types of the plurality of test units and test sequences of the test types;

a first arrangement sequence submodule, configured to determine, based on the test types and the test sequences, an arrangement sequence of the plurality of the test program components configured with parameters; and a first test program submodule, configured to combine, according to the arrangement sequence to acquire the test program, the plurality of the test program components.

10. The device for generating a test program according to claim 7, wherein the component combining module comprises:

a second test unit determining submodule, configured to determine, according to the configuration information, a plurality of memory channels in the memory and test units to be tested in each of the plurality of memory channels;

a second relationship determining submodule, configured to determine, according to the test logic, a correlation between the plurality of test program components and the test units in each of the plurality of memory channels;

a second parameter configuration submodule, configured to perform, based on the correlation, parameter configuration on each of the plurality of test program components;

a second component combining submodule, configured to acquire a plurality of channel test subprograms with respect to the plurality of memory channels by respectively combining the plurality of the test program components configured with parameters with respect to each of the plurality of memory channels; and a program combining submodule, configured to combine the plurality of channel test subprograms to acquire the test program.

11. The device for generating a test program according to claim 10, wherein the second component combining submodule comprises:

a second test sequence submodule, configured to determine, according to the test logic, test types of the test units to be tested in each of the plurality of memory channels and test sequences of the test types;

a second arrangement sequence submodule, configured to determine, based on the test types and the test sequences, an arrangement sequence of the plurality of the test program components configured with parameters, and the plurality of the test program components with respect to each of the plurality of memory channels; and a second test program submodule, configured to combine the plurality of test program components according to the arrangement sequence to acquire the plurality of channel test subprograms with respect to the plurality of memory channels.

12. The device for generating a test program according to claim 7, wherein the information acquiring module comprises:

a record acquiring submodule, configured to acquire a test task information for the memory and a test history record of the memory; and a logic generating submodule, configured to generate, based on the test task information and the test history record, the test logic for the memory.

13. A non-transitory computer readable storage medium storing a computer program, wherein the computer program is executed by a processor to perform operations including:

acquiring configuration information of the memory and a test logic for the memory;

determining, according to the test logic, at least one type of test program components from a preset test program component library; and acquiring a test program according to the configuration information by combining a plurality of test program components, wherein types of the plurality of test program components are included in the determined at least one type of test program components, wherein after acquiring the test program according to the configuration information by combining the plurality of the test program components, the method further comprises:

acquiring timing interval information corresponding to the test logic; and adjusting, based on the timing interval information, timing intervals among the plurality of test program components in the test program.

14. The non-transitory computer readable storage medium according to claim 13, wherein acquiring the test program according to the configuration information by combining the plurality of test program components comprises:

determining, according to the configuration information, a plurality of test units to be tested in the memory;

determining, according to the test logic, a correlation between the plurality of test program components and the plurality of test units;

performing, based on the correlation, a parameter configuration on each of the plurality of test program components; and acquiring the test program by combining the plurality of the test program components configured with parameters.

15. The non-transitory computer readable storage medium according to claim 13, wherein acquiring the test program according to the configuration information by combining the plurality of test program components comprises:

determining, according to the configuration information, a plurality of memory channels in the memory and test units to be tested in each of the plurality of memory channels;

determining, according to the test logic, a correlation between the plurality of test program components and the test units to be tested in each of the plurality of memory channels;

performing, based on the correlation, a parameter configuration on each of the plurality of test program components;

acquiring a plurality of channel test subprograms with respect to the plurality of memory channels by respectively combining the plurality of the test program components configured with parameters with respect to each of the plurality of memory channels; and combining the plurality of channel test subprograms to acquire the test program.

16. The non-transitory computer readable storage medium according to claim 13, wherein acquiring the test logic for the memory comprises:

acquiring a test task information for the memory and a test history record of the memory; and generating, based on the test task information and the test history record, the test logic for the memory.

17. An electronic equipment, comprising:

a processor;

a computer readable storage medium, configured to store executable instructions for the processor;

wherein the processor is configured to execute the executable instructions and to perform operations including:

acquiring configuration information of the memory and a test logic for the memory;

determining, according to the test logic, at least one type of test program components from a preset test program component library; and acquiring a test program according to the configuration information by combining a plurality of test program components, wherein types of the plurality of test program components are included in the determined at least one type of test program components, wherein after acquiring the test program according to the configuration information by combining the plurality of the test program components, the method further comprises:

acquiring timing interval information corresponding to the test logic; and adjusting, based on the timing interval information, timing intervals among the plurality of test program components in the test program.

18. The electronic equipment according to claim 17, wherein acquiring the test program according to the configuration information by combining the plurality of test program components comprises:

determining, according to the configuration information, a plurality of test units to be tested in the memory;

determining, according to the test logic, a correlation between the plurality of test program components and the plurality of test units;

performing, based on the correlation, a parameter configuration on each of the plurality of test program components; and acquiring the test program by combining the plurality of the test program components configured with parameters.

19. The electronic equipment according to claim 17, wherein acquiring the test program according to the configuration information by combining the plurality of test program components comprises:

determining, according to the configuration information, a plurality of memory channels in the memory and test units to be tested in each of the plurality of memory channels;

determining, according to the test logic, a correlation between the plurality of test program components and the test units to be tested in each of the plurality of memory channels;

performing, based on the correlation, a parameter configuration on each of the plurality of test program components;

acquiring a plurality of channel test subprograms with respect to the plurality of memory channels by respectively combining the plurality of the test program components configured with parameters with respect to each of the plurality of memory channels; and combining the plurality of channel test subprograms to acquire the test program.

20. The electronic equipment according to claim 17, wherein acquiring the test logic for the memory comprises:
   acquiring a test task information for the memory and a test history record of the memory; and
   generating, based on the test task information and the test history record, the test logic for the memory.

\* \* \* \* \*